US012355430B2

(12) United States Patent
Wang

(10) Patent No.: US 12,355,430 B2
(45) Date of Patent: Jul. 8, 2025

(54) HIGH-POWER PRODUCT SWITCH PROTECTION SYSTEM AND HIGH POWER PRODUCT SWITCH PROTECTION METHOD

(71) Applicant: STAR TECHNOLOGIES, INC., Hsinchu (TW)

(72) Inventor: Li-Min Wang, Taichung (TW)

(73) Assignee: STAR TECHNOLOGIES, INC., Hsinchu (TW)

( * ) Notice: Subject to any disclaimer, the term of this patent is extended or adjusted under 35 U.S.C. 154(b) by 242 days.

(21) Appl. No.: 18/129,931

(22) Filed: Apr. 3, 2023

(65) Prior Publication Data

US 2024/0171172 A1    May 23, 2024

(30) Foreign Application Priority Data

Nov. 18, 2022    (TW) .................................. 111144090

(51) Int. Cl.
*H03K 17/08* (2006.01)

(52) U.S. Cl.
CPC .................................... *H03K 17/08* (2013.01)

(58) Field of Classification Search
CPC ...... H03K 17/08; H03K 17/082; H02H 7/222; H02H 1/0007; G01D 21/02
See application file for complete search history.

(56) References Cited

U.S. PATENT DOCUMENTS

| | | | |
|---|---|---|---|
| 10,630,069 B2 * | 4/2020 | Kennedy | H02H 3/445 |
| 2019/0103742 A1 * | 4/2019 | Kennedy | H01H 89/00 |
| 2020/0366078 A1 * | 11/2020 | Telefus | H02H 3/044 |
| 2021/0226441 A1 * | 7/2021 | Telefus | H02H 3/162 |
| 2021/0234356 A1 * | 7/2021 | Telefus | G01R 19/16566 |
| 2022/0352841 A1 * | 11/2022 | Steinberger | H02H 1/0007 |

FOREIGN PATENT DOCUMENTS

| | | | |
|---|---|---|---|
| CN | 110752664 A | * | 2/2020 |
| CN | 215070901 U | * | 12/2021 |

* cited by examiner

*Primary Examiner* — Rexford N Barnie
*Assistant Examiner* — Nicolas Bellido
(74) *Attorney, Agent, or Firm* — Li & Cai Intellectual Property (USA) Office

(57) ABSTRACT

A switch protection system and a switch protection method are provided. The switch protection system includes a switch, a sensor assembly, and a microcontroller. The switch is configured to control a conductive state or a non-conductive state of a circuit. The sensor assembly is arranged between a power source and the switch, so as to sense a circuit signal value between the power source and the switch. The microcontroller is correspondingly connected to the switch and the sensor assembly so as to receive the circuit signal value, and compare the circuit signal value with a threshold value to determine whether or not to execute a control instruction. The control instruction is configured to switch the conductive state and the non-conductive state of the switch. When the circuit signal value is less than or equal to the threshold value, the microcontroller is configured to execute the control instruction.

6 Claims, 7 Drawing Sheets

HIGH-POWER PRODUCT SWITCH PROTECTION SYSTEM AND HIGH POWER PRODUCT SWITCH PROTECTION METHOD

CROSS-REFERENCE TO RELATED PATENT APPLICATION

This application claims the benefit of priority to Taiwan Patent Application No. 111144090, filed on Nov. 18, 2022. The entire content of the above identified application is incorporated herein by reference.

FIELD OF THE DISCLOSURE

The present disclosure relates to a switch protection system and a switch protection method, and more particularly to a switch protection system and a switch protection method for high-power products.

BACKGROUND OF THE DISCLOSURE

A switch is a power channel element disposed between a power source and a load. The system may determine whether or not to provide power to the load by controlling a conduction of the switch. It should be noted that when the switch is switched between a conductive state and a non-conductive state, the switch may not be able to withstand an instantaneous power change, thereby causing the risk of damage to the switch.

Since a cost of the switching for electrical appliances rated from 10 W to 2200 W (such as clothes dryers rated at 1500 Wand induction cookers rated from 800 W to 2200 W) are relatively low, and an instantaneous power change is within an acceptable range of the switch, it is usually not needed to have an additional protection circuit designed for the switch. However, for an electrical appliance with a power up to several thousand watts, a power change of several thousand watts will be generated when switching, which drastically increases the risk of damage to the switch. In addition, the cost of the switch used in such high-power electrical appliances is high, and damage of the switch results in higher manpower and cost for maintenance.

Therefore, how to improve a protection effect of the switch by improving a structural design to overcome the above-mentioned defects, has become one of the important issues to be solved in the related field.

SUMMARY OF THE DISCLOSURE

In response to the above-referenced technical inadequacies, the present disclosure provides a switch protection system and a switch protection method.

In order to solve the above-mentioned problems, one of the technical aspects adopted by the present disclosure is to provide a switch protection system, which includes a switch, a sensor assembly, and a microcontroller. The switch is configured to control a conductive state or a non-conductive state of a circuit. The sensor assembly is arranged between a power source and the switch, so as to sense a circuit signal value between the power source and the switch. The microcontroller is correspondingly connected to the switch and the sensor assembly so as to receive the circuit signal value, and compare the circuit signal value with a threshold value to determine whether or not to execute a control instruction. The control instruction is configured to switch the conductive state and the non-conductive state of the switch. When the circuit signal value is less than or equal to the threshold value, the microcontroller is configured to execute the control instruction.

In certain embodiments, when the circuit signal value is greater than the threshold value, the microcontroller is configured not to execute the control instruction.

In certain embodiments, the switch protection system further includes a central processing unit, and the central processing unit is configured to give the control instruction to the microcontroller.

In certain embodiments, the switch protection system is applied to products with power greater than or equal to 3000 W.

In certain embodiments, the sensor assembly includes a first sensor and a second sensor.

In certain embodiments, each of the first sensor and the second sensor is a voltage sensor, a current sensor, a magnetic field sensor, an electromotive force sensor, or a power sensor.

In order to solve the above-mentioned problems, another one of the technical aspects adopted by the present disclosure is to provide a switch protection method, which including: receiving a control instruction, sensing a circuit signal value between a power source and the switch, and comparing the circuit signal value with a threshold value so as to determine whether or not to execute the control instruction. The control instruction is configured to control a conductive state or a non-conductive state of a switch. When the circuit signal value is less than or equal to the threshold value, the control instruction is executed.

In certain embodiments, when the circuit signal value is greater than the threshold value, the control instruction is not executed.

In certain embodiments, the switch protection method further includes determining an initial state of the switch that the switch is in the conductive state or in the non-conductive state, if the initial state is the same as the control instruction, the control instruction is not executed.

In certain embodiments, the control instruction is transmitted by a central processing unit, and the switch protection method further includes giving feedbacks of a result of the control instruction to the central processing unit.

In certain embodiments, when determining not to execute the control instruction, a microcontroller waits for a next one of the control instruction, so as to sense again and determine whether or not to execute the control instruction.

In certain embodiments, when determining not to execute the control instruction, re-sensing the circuit signal value directly until the circuit signal value is less than or equal to the threshold value, and executing the control instruction.

One of the beneficial effects of the present disclosure is that, in the switch protection system and the switch protection method provided by the present disclosure, by virtue of "the microcontroller receives the circuit signal value and the control instruction, and compares the circuit signal value with the threshold value" and "when the circuit signal value is less than or equal to the threshold value, the microcontroller is configured to execute the control instruction," damage to the switch due to sudden changes in the state of the switch can be avoided.

In order to further understand the features and technical content of the present disclosure, please refer to the following detailed description and drawings of the present disclosure, but the drawings provided are only used for reference and description, and are not intended to limit the disclosure.

DETAILED DESCRIPTION OF THE EXEMPLARY EMBODIMENTS

Figure 1:
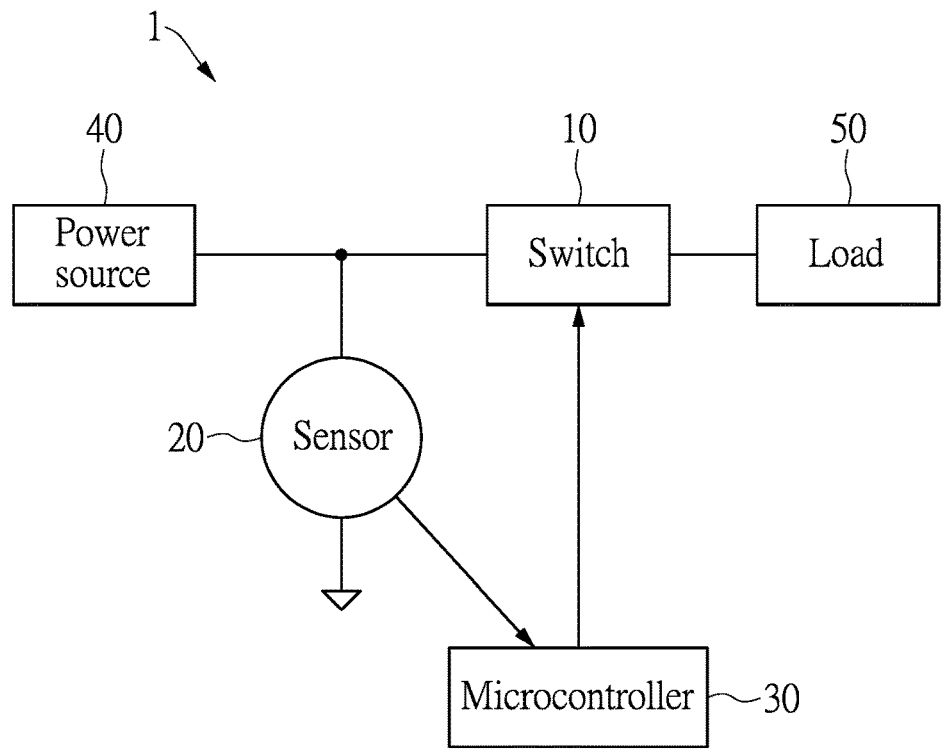
FIG. 1 is a schematic view of a switch protection system according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

First Embodiment

Referring to FIG. 1, a first embodiment of the present disclosure provides a switch protection system 1, which includes a switch 10, a sensor assembly 20, a microcontroller 30, a power source 40, and a load 50. The switch 10 is arranged between the power source 40 and the load 50 to control the power source 40 to provide power to the load 50. Specifically, when the switch 10 is in a conductive state, the power source 40 provides the power to the load 50, and when the switch 10 is in a non-conductive state, the power source 40 does not provide the power to the load 50. In one embodiment, the switch 10 may be used for high-power electrical appliances rated above 3000 W, preferably rated from 4000 W to 6000 W. For example, the switch 10 may be a metal oxide semiconductor field effect transistor (MOSFET), a reed relay, etc., but the present disclosure is not limited thereto.

The sensor assembly 20 is disposed on a circuit between the switch 10 and the power source 40, so as to sense a circuit signal value between the switch 10 and the power source 40. That is, the circuit signal value may reflect a circuit state of a power input side of the switch 10. The sensor assembly 20 may be a voltage sensor, a current sensor, a magnetic field sensor, an electromotive force sensor or a power sensor. However, the above-mentioned example is only one possible embodiment and is not intended to limit the present disclosure.

The microcontroller 30 may be connected to the switch 10 and the sensor assembly 20 and transmit the circuit signal value sensed by the sensor assembly 20 to the microcontroller 30. The connection method may be a wired connection or a wireless connection, such as BLUETOOTH® or WI-FI®, but the present disclosure is not limited thereto. When receiving the circuit signal value, the microcontroller 30 compare the circuit signal value with a threshold value, and determine whether or not to execute a control instruction. For example, when the circuit signal value is less than or equal to the threshold value, the microcontroller 30 is configured to execute the control instruction. When the circuit signal value is greater than the threshold value, the microcontroller 30 is configured not to execute the control instruction. The control instruction may be configured to switch the conductive state and the non-conductive state of the switch 10. For example, when the switch 10 is in the conductive state, the switch 10 is instructed to be off. When the switch 10 is in the non-conductive state, the switch 10 is instructed to be on. Generally, the threshold value is related to parameters of voltage, current or power and the parameters depend on tolerance values of the voltage, current or power of the switch 10.

For example, the sensor assembly 20 may be a power sensor. When receiving the control instruction, the microcontroller 30 compares a power value sensed by the sensor assembly 20 with a power threshold value. When the power value is less than or equal to the power threshold value, the microcontroller 30 is configured to execute the control instruction. In addition, considering the directionality of the current, the step of comparing the circuit signal value with the threshold value in the present disclosure is to compare its absolute value, and a safe value that the switch 10 may withstand as the threshold value is adopted. The switch protection system 1 of the present disclosure may be suitable for protecting different switches 10.

Second Embodiment

Figure 2:
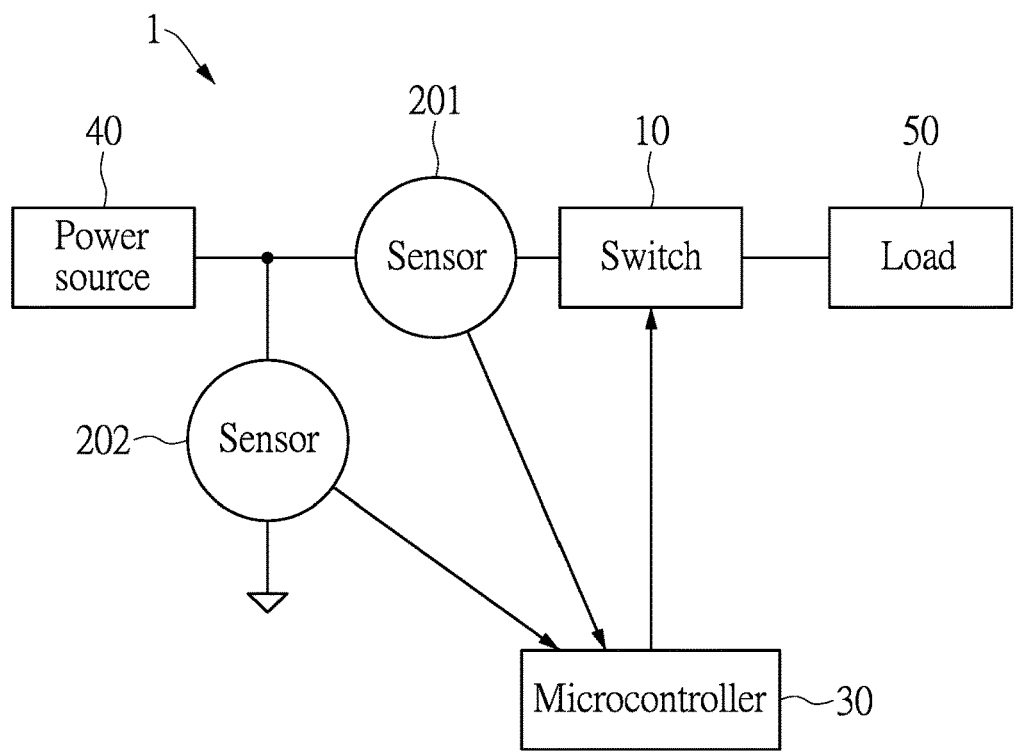
FIG. 2 is a schematic view according to a second embodiment.

Referring to FIG. 2, a second embodiment of the present disclosure is shown. The present embodiment is substantially the same as the first embodiment, and the differences are described as follows.

In the present embodiment, the sensor assembly 20 can include a first sensor 201 and a second sensor 202. Each of the first sensor 201 and the second sensor 202 can be a voltage sensor, a current sensor, a magnetic field sensor, an electromotive force sensor, or a power sensor. For example, the first sensor 201 is a voltage sensor, and the second sensor 202 is a current sensor.

The first sensor 201 senses a voltage value and transmits the voltage value to the microcontroller 30, and the second sensor 202 senses a current value and transmits the current value to the microcontroller 30. The microcontroller 30 compares the voltage value with a voltage threshold value. When the voltage value is less than or equal to the voltage threshold value, the microcontroller 30 is configured to execute the control instruction. When the voltage value is greater than the voltage threshold value, the microcontroller 30 is configured not to execute the control instruction. Similarly, the microcontroller 30 compares the current value with a current threshold value. When the current value is less than or equal to the current threshold value, the microcontroller 30 is configured to execute the control instruction. When the current value is greater than the current threshold value, the microcontroller 30 is configured not to execute the control instruction.

It should be noted that, when the voltage value is less than or equal to the voltage threshold value, but the current value is greater than the current threshold value, the microcontroller 30 is configured not to execute the control instruction.

That is, in the case of multiple sensing conditions, the microcontroller 30 is configured to execute the control instruction only if the sensed values satisfying all the sensing conditions are less than or equal to the threshold value, so that the switch 10 can be protected more strictly.

Third Embodiment

Figure 3:
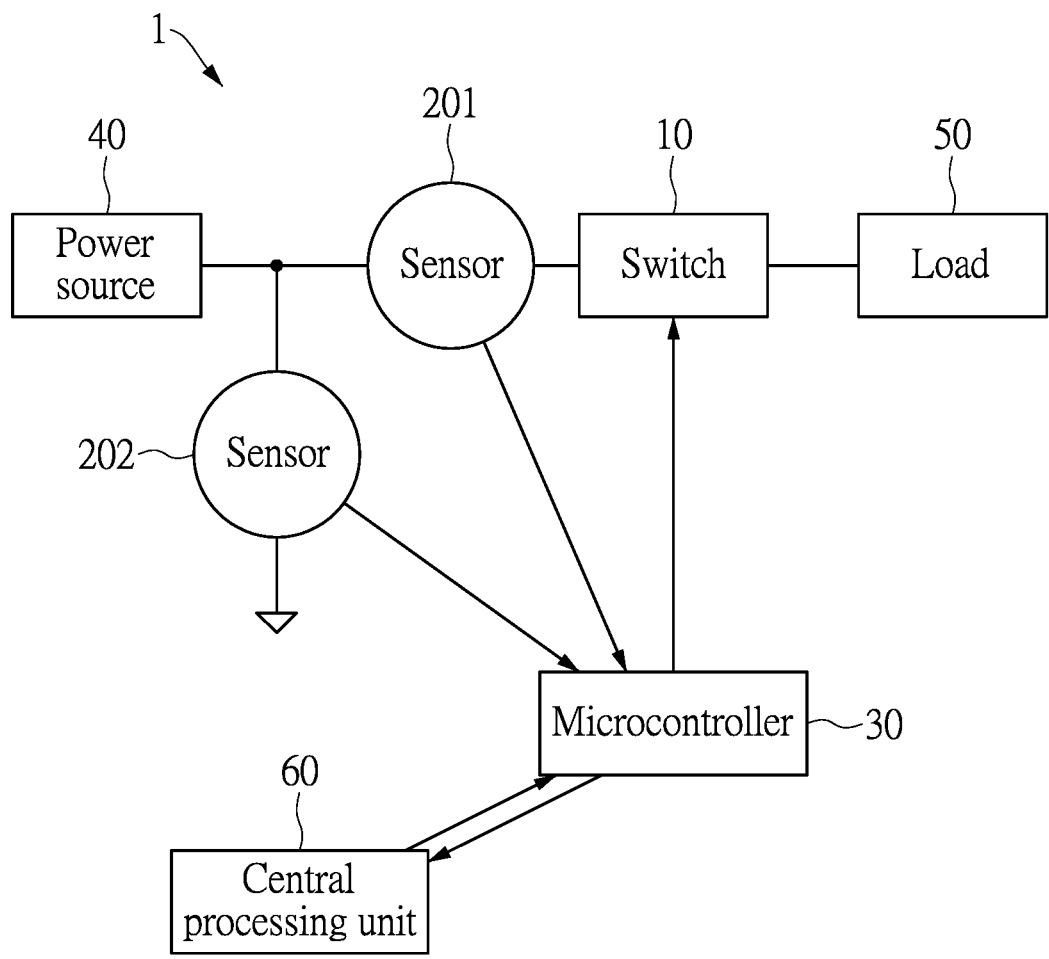
FIG. 3 is a schematic view according to a third embodiment.

Referring to FIG. 3, a third embodiment of the present disclosure is shown. The present embodiment is substantially the same as the second embodiment, and the differences are described as follows.

In the present embodiment, the switch protection system 1 may include a central processing unit 60, and the central processing unit 60 is used to issue the control instruction to the microcontroller 30. After the microcontroller 30 determines whether or not to execute the control instruction, the microcontroller 30 gives feedbacks of a result of the control instruction to the central processing unit 60.

Fourth Embodiment

Figure 4:
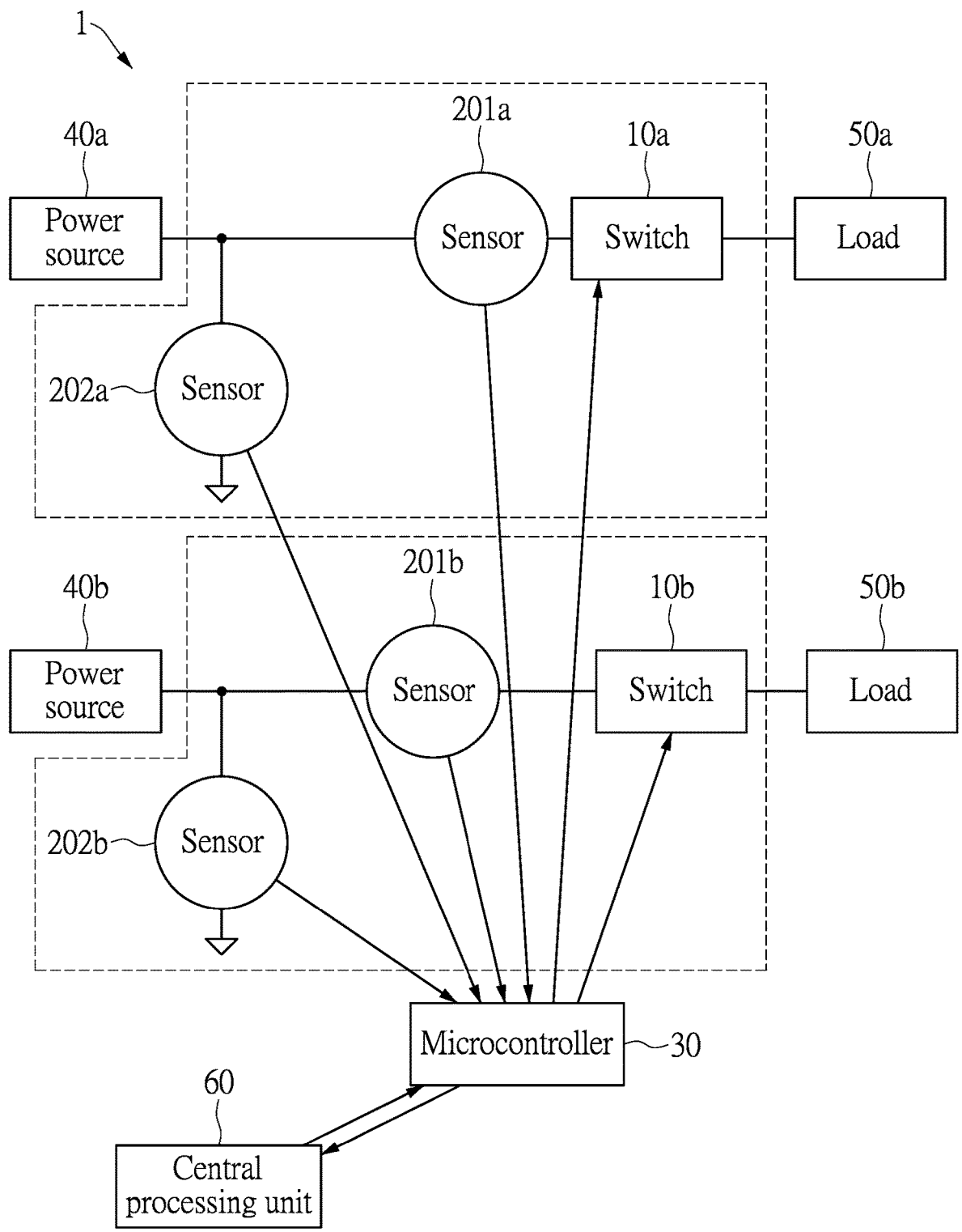
FIG. 4 is a schematic view according to a fourth embodiment.

Referring to FIG. 4, a fourth embodiment of the present disclosure is shown. The present embodiment is substantially the same as the third embodiment, and the differences are described as follows.

In the present embodiment, the switch protection system 1 may be used to protect multiple switches. Specifically, the microcontroller 30 may control a switch 10*a* and a switch 10*b*, and a sensor 201*a* and a sensor 202*a* are arranged between the switch 10*a* and a power source 40*a*, and a sensor 201*b* and a sensor 201*b* are arranged between the switch 10*b* and a power source 40*b*. When the microcontroller 30 receives the control instruction from the central processing unit 60, each of the sensor 201*a*, the sensor 202*a*, the sensor 201*b*, and the sensor 202*b* transmits the circuit signal value sensed to the microcontroller 30, and the microcontroller 30 compares the circuit signal value with the threshold value to determine whether or not to execute the control instruction to the switch 10*a* and the switch 10*b*.

Fifth Embodiment

Figure 5:
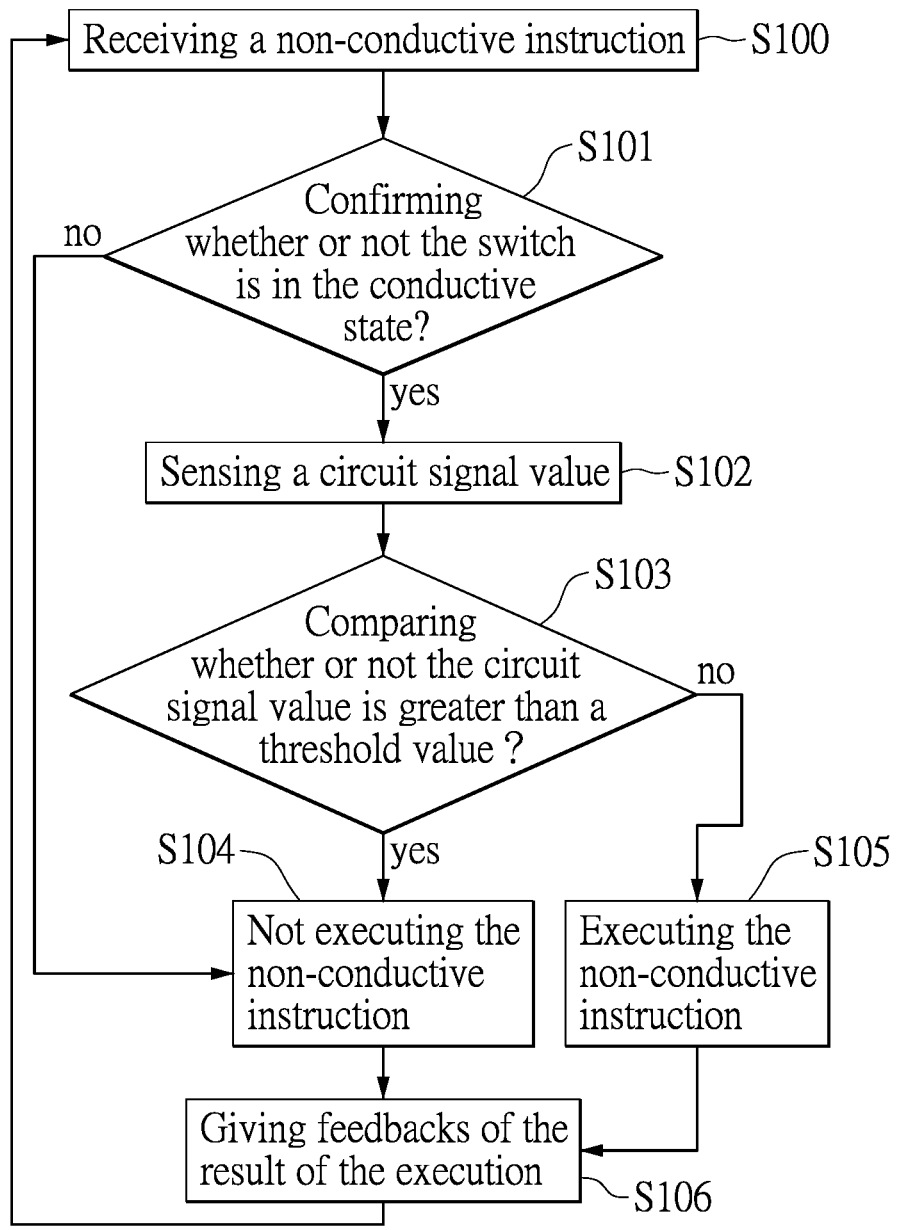
FIG. 5 is a flowchart of a switch protection method for operating a switch to be in a non-conductive state of the present disclosure.

Referring to FIG. 5, a flowchart of operating the switch to be in the non-conductive state of the present disclosure is shown. A switch protection method of the present disclosure at least includes the following steps: receiving a non-conductive instruction (step S100), sensing a circuit signal value (step S102), and comparing the circuit signal value with a threshold value (step S103). Specifically, after the microcontroller 30 receives the non-conductive instruction from the central processing unit 60, the sensor assembly 20 senses the circuit signal value on the circuit, and transmits the sensed result to the microcontroller 30. The microcontroller 30 compares the circuit signal value with the threshold value. If the circuit signal value is less than or equal to the threshold value, the method proceeds to executing the non-conductive instruction (step S105), and if the circuit signal value is greater than the threshold value, the method proceeds to not executing the non-conductive instruction (step S104).

Further, in addition to sensing the circuit signal value of the switch 10, the sensor assembly 20 also senses a conduction state of the switch 10. Before step S102, a step of confirming whether or not the switch 10 is in the conductive state (step S101) can be performed. If the switch 10 is not in the conductive state, that is, the switch 10 is in the non-conductive state, the non-conductive instruction is not needed to be executed again. Finally, in step S106, the microcontroller 30 gives feedbacks of the result of the execution to the central processing unit 60.

In one embodiment, when the power source 40 is still providing power, the microcontroller 30 senses the current existing in the switch 10 through the sensor assembly 20, and the current value on the switch 10 is greater than the current threshold value. Accordingly, the microcontroller 30 is configured to reject the non-conductive instruction from the central processing unit 60, and give feedbacks of the result of rejecting the non-conductive instruction to the central processing unit 60. When the central processing unit 60 issues the non-conductive instruction again, the current value is compared with the current threshold value again. If the current value is less than or equal to the current threshold value, the non-conductive instruction is executed and the feedbacks of the result is given to the central processing unit 60.

In one embodiment, the power source 40 stops providing power, but there is a reverse current. That is, the microcontroller 30 senses the current existing in the switch 10 through the sensor assembly 20, and rejects the non-conductive instruction from the central processing unit 60. However, the microcontroller 30 also compares the current value caused by the reverse current on the switch 10 with the current threshold value. If the current value is less than or equal to the current threshold value, the microcontroller 30 is configured to executes the non-conductive instruction and gives feedbacks of the execution result of the non-conductive instruction of the switch 10 to the central processing unit 60.

In one embodiment, the power source 40 stops providing power, and there is no reverse current, that is, the system is in a completely static state. When receiving the non-conductive instruction, the microcontroller 30 gives feedbacks of a message that the non-conductive instruction has been received to the central processing unit 60, and executes the non-conductive instruction, and then gives feedbacks of the execution result that the switch 10 is non-conductive to the central processing unit 60.

Sixth Embodiment

Figure 6:
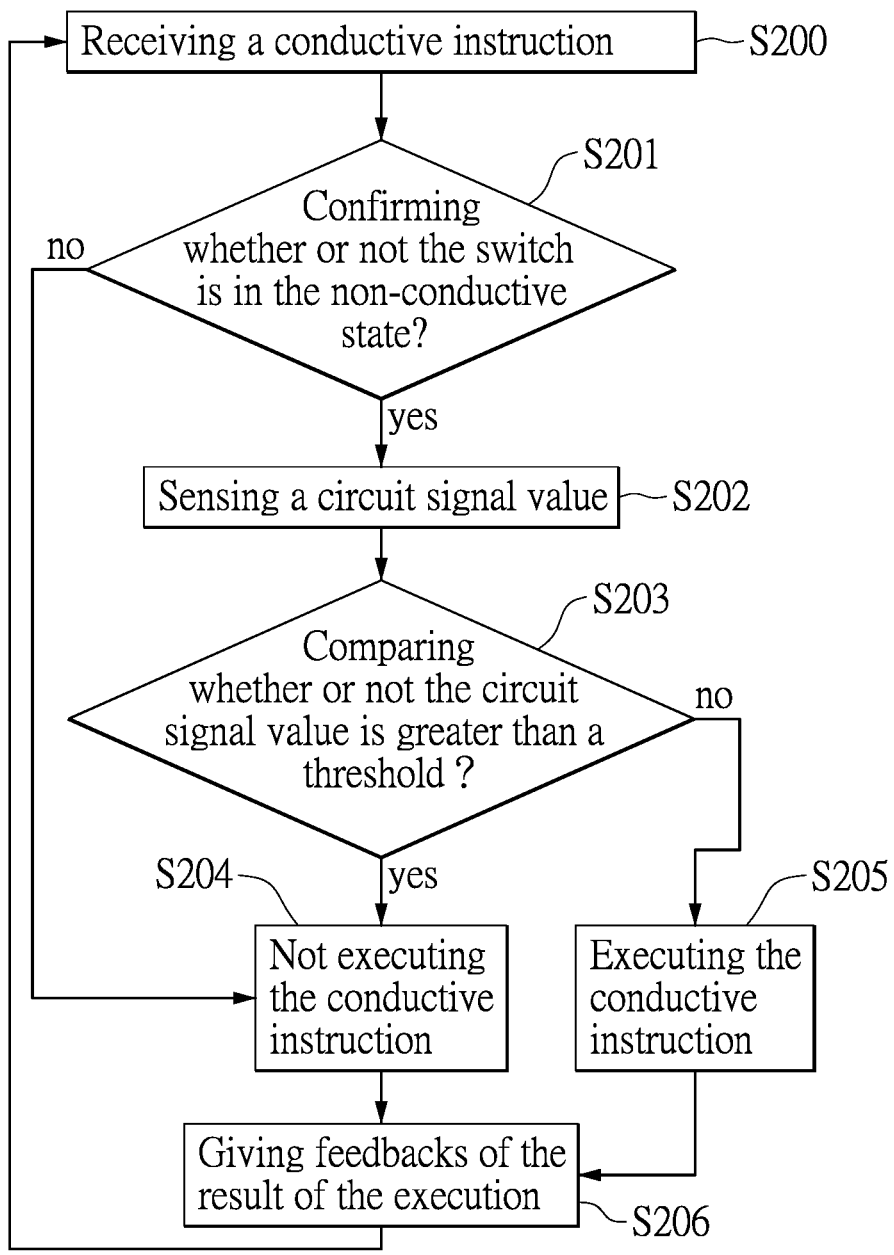
FIG. 6 is a flowchart of a switch protection method for operating the switch to be in a conductive state of the present disclosure.

Referring to FIG. 6, a flowchart of operating the switch to be in the conductive state of the present disclosure is shown. A switch protection method of the present disclosure at least includes the following steps: receiving a conduction instruction (step S200), sensing a circuit signal value (step S202), and comparing the circuit signal value with a threshold value (step S203). Specifically, after the microcontroller 30 receives the conduction instruction from the central processing unit 60, the sensor assembly 20 senses the circuit signal value on the circuit, and transmits the sensed result to the microcontroller 30. The microcontroller 30 compares the circuit signal value with the threshold value. If the circuit signal value is less than or equal to the threshold value, the method proceeds to executing the conduction instruction (step S205). If the circuit signal value is greater than the threshold value, the method proceeds to not executing the conduction instruction (step S204).

Further, in addition to sensing the circuit signal value of the switch 10, the sensor assembly 20 also senses the conduction state of the switch 10. Before step S202, a step of confirming whether or not the switch 10 is in the non-conduction state (step S201) can be performed. If the switch 10 is not in the non-conduction state, that is, the switch 10 is in the conduction state, there is no need to execute the conduction instruction again. Finally, in step S206, the microcontroller 30 gives feedbacks of the execution result to the central processing unit 60.

In one embodiment, the power source 40 is turned off, and there is no voltage in the load 50. The microcontroller 30 gives feedbacks of the message that the conduction instruction has been received to the central processing unit 60, and executes the conduction instruction, and gives feedbacks of the execution result that the switch 10 has been conducted to the central processing unit 60.

In one embodiment, when the power source 40 is turned off, but the voltage exists in the load 50, the microcontroller 30 senses that there is the voltage in the switch 10 through the sensor assembly 20, and senses a voltage value, and reject the conduction instruction of the central processing unit 60. However, the microcontroller 30 also compares the voltage value with the voltage threshold value. If the voltage value is less than or equal to the voltage threshold value, the conduction instruction is executed, and feedbacks of the execution result that the switch 10 is on the conduction state are given to the central processing unit 60.

In one embodiment, when the power source 40 is turned on, and no matter whether or not there is voltage in the load 50, the microcontroller 30 senses the voltage value through the sensor assembly 20, and compares the voltage value with the voltage threshold value. When the voltage value is less than or equal to the voltage threshold value, the conduction instruction is executed, and then feedbacks of the execution result that the switch 10 is on the conduction state are given to the central processing unit 60. Conversely, when the voltage value is greater than the voltage threshold value, the microcontroller 30 is configured not to execute the conduction instruction, and gives feedbacks of the result of not executing the conduction instruction to the central processing unit 60.

Seventh Embodiment

Figure 7:
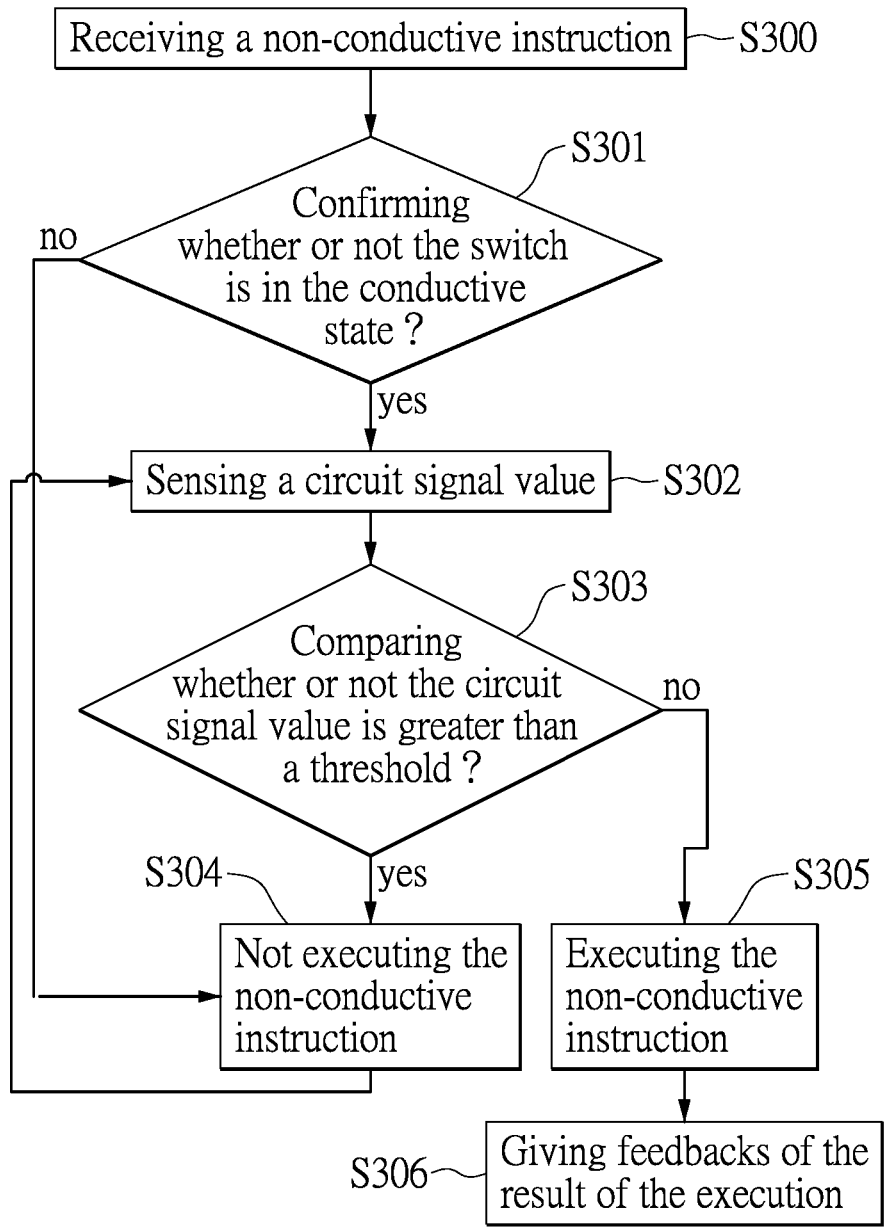
FIG. 7 is a flowchart of a switch protection method for operating the switch to be in the non-conductive state according to another embodiment of the present disclosure.

Referring to FIG. 7, a flowchart of a switch protection method for operating the switch to be in the non-conductive state according to another embodiment of the present disclosure is shown. The switch protection method of the present disclosure at least includes S300: receiving a non-conductive instruction, S302: sensing a circuit signal value, and S303: comparing the circuit signal value with a threshold value. Specifically speaking, after the microcontroller 30 receives the non-conductive instruction from the central processing unit 60, the sensor assembly 20 senses the circuit signal value on the circuit, and transmits the sensed result to the microcontroller 3. The microcontroller 30 compares the circuit signal value with the threshold value, and if the circuit signal value is less than or equal to the threshold value, proceed to step S305: executing the non-conductive instruction; if the circuit signal value is greater than the threshold value, proceed to step S304: not executing the non-conductive instruction.

Different from the embodiments above, when the processing result is S304: when not executing the non-conductive instruction, the sensor assembly 20 automatically repeats the step of S302: sensing the circuit signal value until the circuit signal value is less than or equal to threshold value, and go to step S305: executing the non-conductive instruction. That is to say, in the case of not executing the non-conductive instruction, the feedbacks of the result may not be given to the central processing unit 60, and the sensing may be performed again directly, so as to save processing time.

Eighth Embodiment

Figure 8:
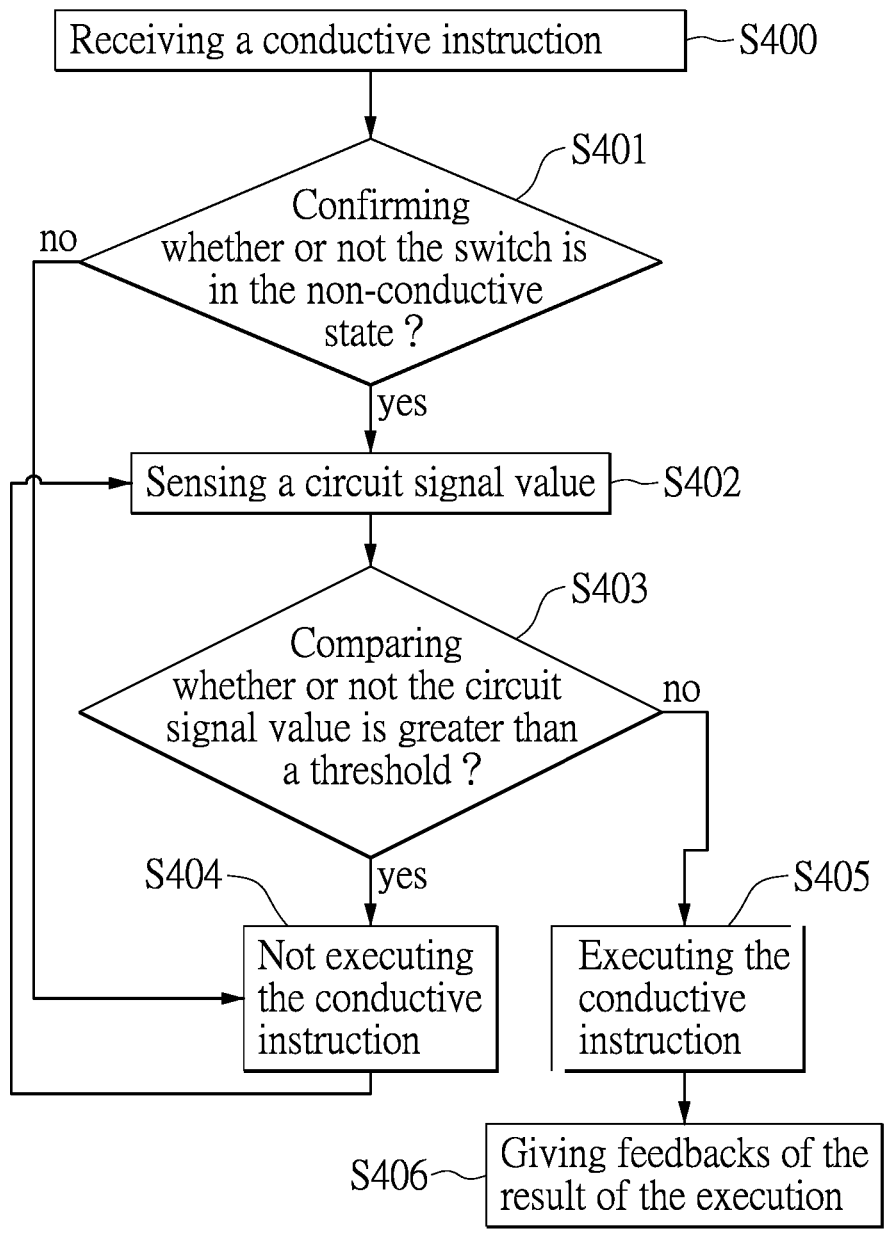
FIG. 8 is a flowchart of a switch protection method for operating the switch to be in the conductive state according to another embodiment of the present disclosure.

Referring to FIG. 8, a flowchart of a switch protection method for operating the switch to be in the conductive state according to another embodiment of the present disclosure is shown. The switch protection method of the present disclosure at least includes S400: receiving a conductive instruction, S402: sensing a circuit signal value, and S403: comparing the circuit signal value with a threshold value. Specifically speaking, after the microcontroller 30 receives the conductive instruction from the central processing unit 60, the sensor assembly 20 senses the circuit signal value on the circuit, and transmits the sensed result to the microcontroller 30. The microcontroller 30 compares the circuit signal value with the threshold value, and if the circuit signal value is less than or equal to the threshold value, proceed to step S405: executing the conductive instruction; if the circuit signal value is greater than the threshold value, proceed to step S404: not executing the conductive instruction.

Different from the embodiments above, when the processing result is S404: when not executing the conduction instruction, the sensor assembly 20 automatically repeats the step of S402: sensing the circuit signal value until the circuit signal value is less than or equal to the threshold value, and proceeding to step S405: executing the conduction instruction. That is to say, in the case of not executing the conduction instruction, the feedbacks of the result may not be given to the central processing unit 60, and the sensing may be performed again directly, so as to save processing time.

BENEFICIAL EFFECTS OF THE EMBODIMENTS

One of the beneficial effects of the present disclosure is that, in the switch protection system and the switch protection method provided by the present disclosure, by virtue of "the microcontroller receives the circuit signal value and the control instruction, and compares the circuit signal value with the threshold value" and "when the circuit signal value is less than or equal to the threshold value, the microcontroller is configured to execute the control instruction," damage to the switch due to sudden changes in the state of the switch can be avoided.

Further, in the case that the conduction instruction is not executed by the switch protection system and switch protection method provided by the present disclosure, the microcontroller 30 waits for the next instruction to re-sense and judge until all sensing conditions are satisfied. Afterwards, the microcontroller 30 is configured to execute the control instruction to achieve the effect of protecting the switch. In addition, the switch protection system and switch protection method provided by the present disclosure may also directly re-sense and judge without executing the conduction instruction, and execute the control instruction until all sensing conditions are satisfied, so as to achieve efficacy of the switch protection and processing efficiency together.

Further, when the current value on the switch 10 is greater than the current threshold value, the microcontroller 30 gives feedbacks of the result of not executing the instruction to the central processing unit 60, so that the central processing unit 60 issues an instruction to control the current of the switch 10. For example, the central processing unit 60 may instruct a power controller to reduce the power provided of the power source 40 by less than 10%, so as to prevent the switch 10 from being damaged due to a large change in the current value on the switch 10.

The disclose content above is only the preferred feasible embodiment of the present disclosure, and is not therefore limiting the patent scope of the present disclosure, so all equivalent technical changes made by using the description of the present disclosure and the contents of the drawings are included in this document within the scope of the patent application.

What is claimed is:

1. A switch protection system, comprising:
    a switch configured to control a conductive state or a non-conductive state of a circuit;
    a sensor assembly, wherein the sensor assembly is arranged between a power source and the switch, so as to sense a circuit signal value between the power source and the switch; and
    a microcontroller, wherein the microcontroller is correspondingly connected to the switch and the sensor assembly so as to receive the circuit signal value;
    a central processing unit configured to give a control instruction to the microcontroller, wherein the control instruction is configured to switch the conductive state and the non-conductive state of the switch,
    wherein, when the microcontroller receives the control instruction from the central processing unit, the microcontroller compares the circuit signal value with a threshold value to determine whether or not to execute the control instruction,
    wherein, when the circuit signal value is less than or equal to the threshold value, the microcontroller is configured to execute the control instruction,
    wherein, when the circuit signal value is greater than the threshold value, the microcontroller is configured not to execute the control instruction,
    wherein the microcontroller gives feedbacks of a result of the control instruction to the central processing unit after the microcontroller determines whether or not to execute the control instruction,
    wherein, when the conduction instruction is not executed, the microcontroller is configured to wait for a next one of the control instruction to re-sense the circuit signal value directly, and the conduction instruction is executed until all sensing conditions are satisfied,
    wherein the threshold value is a safety value that the switch withstands.

2. The switch protection system according to claim 1, wherein the switch protection system is applied to products with power greater than or equal to 3000 W.

3. The switch protection system according to claim 1, wherein the sensor assembly includes a first sensor and a second sensor.

4. The switch protection system according to claim 3, wherein each of the first sensor and the second sensor is a voltage sensor, a current sensor, a magnetic field sensor, an electromotive force sensor or a power sensor.

5. A switch protection method, comprising:
    receiving a control instruction from a central processing unit by a microcontroller, the control instruction is configured to control a conductive state or a non-conductive state of a switch;
    sensing a circuit signal value between a power source and the switch by a sensor assembly; and
    comparing the circuit signal value with a threshold value so as to determine whether or not to execute the control instruction by the microcontroller;
    wherein, when the circuit signal value is less than or equal to the threshold value, the control instruction is executed by the microcontroller,
    wherein, when the circuit signal value is greater than the threshold value, the control instruction is not executed by the microcontroller,
    wherein the microcontroller gives feedbacks of a result of the control instruction to the central processing unit after the microcontroller determines whether or not to execute the control instruction,
    wherein, when the conduction instruction is not executed, the microcontroller is configured to wait for a next one of the control instruction to re-sense the circuit signal value directly, and the conduction instruction is executed until all sensing conditions are satisfied,
    wherein the threshold value is a safety value that the switch withstands.

6. The switch protection method according to claim 5, further comprising:
    determining an initial state of the switch that the switch is in the conductive state or in the non-conductive state;
    wherein, when the initial state is the same as the control instruction, the control instruction is not executed.

* * * * *